(12) United States Patent
Balakrishnan et al.

(10) Patent No.: US 10,937,903 B2
(45) Date of Patent: Mar. 2, 2021

(54) TWIN GATE FIELD EFFECT DIODE

(71) Applicant: INTERNATIONAL BUSINESS MACHINES CORPORATION, Armonk, NY (US)

(72) Inventors: Karthik Balakrishnan, White Plains, NY (US); Pouya Hashemi, White Plains, NY (US); Bahman Hekmatshoartabari, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 12 days.

(21) Appl. No.: 16/251,607

(22) Filed: Jan. 18, 2019

(65) Prior Publication Data

US 2019/0157453 A1  May 23, 2019

Related U.S. Application Data

(62) Division of application No. 15/672,967, filed on Aug. 9, 2017, now Pat. No. 10,276,714.

(51) Int. Cl.
*H01L 29/78* (2006.01)
*H01L 29/66* (2006.01)
(Continued)

(52) U.S. Cl.
CPC ...... *H01L 29/7827* (2013.01); *H01L 29/4232* (2013.01); *H01L 29/66356* (2013.01);
(Continued)

(58) Field of Classification Search
CPC .......... H01L 29/7827; H01L 29/66545; H01L 29/66666; H01L 29/7831; H01L 27/0288;
(Continued)

(56) References Cited

U.S. PATENT DOCUMENTS 9,391,065 B1 * 7/2016 Gauthier, Jr. ....... H01L 29/0649
9,780,088 B1 * 10/2017 Balakrishnan ...... H01L 27/0629
(Continued)

OTHER PUBLICATIONS

Salman, A.A. et al., "Field Effect Diode (FED): A novel device for ESD protection in deep sub-micron SOI technologies" Proc. IEEE International Electron Devices Meeting (Dec. 2006) pp. 1-4.
(Continued)

*Primary Examiner* — Shahed Ahmed
(74) *Attorney, Agent, or Firm* — Tutunjian & Bitetto, P.C.; Erik Johnson

(57) ABSTRACT

A semiconductor diode including a first conductivity type region on an upper surface of a semiconductor substrate, a fin structure atop the first conductivity type region providing a vertically orientated semiconductor base region, and a second conductivity type region at a second end of the fin structure opposite a first end of the fin structure that is in contact with the first conductivity type region. The semiconductor diode may also include a vertically orientated dual gate that is present around the fin structure. The vertically orientated dual gate including a first gate structure that is present abutting the semiconductor substrate and a second gate structure that is in closer proximity to the second conductivity type region than the first conductivity type region. The first gate structure separated from the second gate structure by a dielectric inter-gate spacer.

20 Claims, 5 Drawing Sheets

(51) Int. Cl.
*H01L 29/423* (2006.01)
*H01L 29/739* (2006.01)
*H01L 29/06* (2006.01)

(52) U.S. Cl.
CPC .. *H01L 29/66545* (2013.01); *H01L 29/66666* (2013.01); *H01L 29/7391* (2013.01); *H01L 29/7831* (2013.01); *H01L 29/0657* (2013.01)

(58) Field of Classification Search
CPC ............ H01L 27/0629; H01L 27/0255; H01L 29/0649; H01L 29/0684; H01L 2029/7858; H01L 27/11273; H01L 27/2454; H01L 29/66151; H01L 29/66219; H01L 29/88–885
See application file for complete search history.

(56) References Cited

U.S. PATENT DOCUMENTS

2010/0327319 A1* 12/2010 Iacopi ................ H01L 29/7391
   257/192
2016/0336324 A1* 11/2016 Li ....................... H01L 27/0928
2017/0229443 A1* 8/2017 Gauthier, Jr. ....... H01L 29/0649

OTHER PUBLICATIONS

List of IBM Patents or Patent Applications Treated as Related dated Jan. 18, 2019, 2 pages.

* cited by examiner

FED STATES FOR DIFFERENT GATE AND ANODE BIASES

| $V_d$ ($V_{anode}$ - $V_{cathode}$) | VG ($V_{G1}$ - $V_{G2}$) | FED state | Equivalent circuit |
|---|---|---|---|
| High | High | OFF | PNPN |
| High | Low | ON | PN |
| Low |  | OFF | Diode is off |

FIG. 2

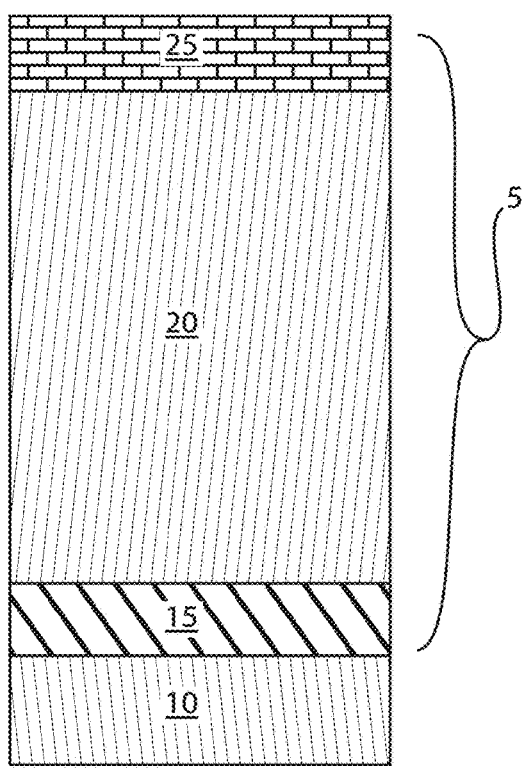
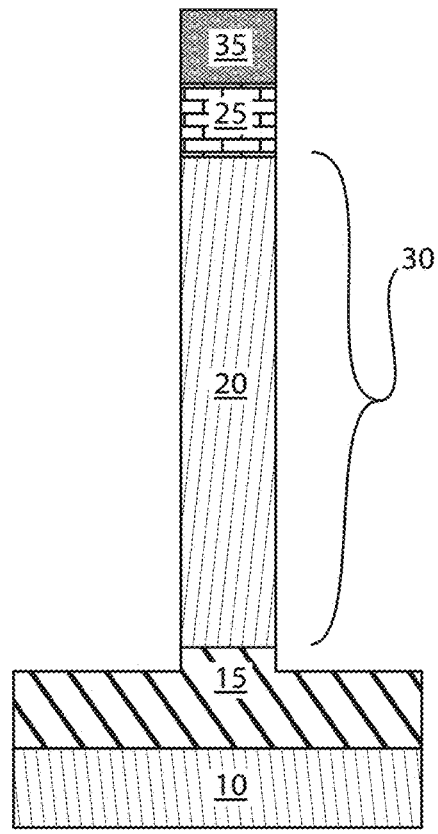
FIG. 3
FIG. 4

TWIN GATE FIELD EFFECT DIODE

BACKGROUND

Technical Field

The methods and structures described herein relate to electronic devices, such as diodes.

Description of the Related Art

In electronics, a diode is a two-terminal electronic component that conducts primarily in one direction (asymmetric conductance); it has low (ideally zero) resistance to the current in one direction, and high (ideally infinite) resistance in the other. A semiconductor diode, the most common type today, is a crystalline piece of semiconductor material with a p-n junction connected to two electrical terminals.

SUMMARY

In one aspect, a semiconductor diode is provided having a vertical orientation. In one embodiment, the semiconductor diode includes a first conductivity type region on an upper surface of a semiconductor substrate, a fin structure atop the first conductivity type region providing a vertically orientated semiconductor base region, and a second conductivity type region at a second end of the fin structure opposite a first end of the fin structure that is in contact with the first conductivity type region. The semiconductor diode may also include a vertically orientated dual gate structure that is present around the fin structure. In one embodiment, the length of a first gate in the vertically orientated dual gate structure to a first junction is the same as the length of a second gate to a second junction. In another embodiment, the length of the first gate in the vertically orientated dual gate structure to the first junction is the greater than a length of a second gate to the second junction.

In another embodiment, the semiconductor diode includes a first conductivity type region on an upper surface of a semiconductor substrate, a fin structure atop the first conductivity type region providing a vertically orientated semiconductor base region, and a second conductivity type region at a second end of the fin structure opposite a first end of the fin structure that is in contact with the first conductivity type region. The semiconductor diode may also include a vertically orientated dual gate that is present around the fin structure. The vertically orientated dual gate including a first gate structure that is present abutting the semiconductor substrate and a second gate structure that is in closer proximity to the second conductivity type region than the first conductivity type region. The first gate structure separated from the second gate structure by a dielectric inter-gate spacer. In one embodiment, the length of the first gate structure in the vertically orientated dual gate structure to a first junction is the same as the length of the second gate structure to a second junction. In another embodiment, the length of the first gate structure in the vertically orientated dual gate structure to a first junction is the greater than a length of the second gate structure to the second junction.

In another aspect, a method of forming a vertically orientated semiconductor diode is provided having a dual gate structure with a vertical orientation. In one embodiment, the method of forming the semiconductor diode includes forming a fin structure of a base semiconductor material having a first end present on a first conductivity type semiconductor material, wherein a second conductivity type semiconductor material is present at a second end of the fin structure opposite the first end. The method may continue with forming a vertically orientated dual gate structure on the fin structure. In one embodiment, the length of a first gate in the vertically orientated dual gate structure to a first junction is the same as the length of a second gate to a second junction. In another embodiment, the length of the first gate in the vertically orientated dual gate structure to the first junction is the greater than a length of the second gate to the second junction.

BRIEF DESCRIPTION OF THE DRAWINGS

The following description will provide details of preferred embodiments with reference to the following figures wherein:

FIG. 2 is a table illustrating the field effect diode (FED) states for one embodiment of the vertically orientated semiconductor diode including the vertically orientated dual gate structure that is depicted in FIG. 1.

FIG. 3 is a side cross-sectional view of a material stack for forming one embodiment of a field effect diode.

FIG. 4 is a side cross-sectional view depicting patterning and etching the material stack depicted in FIG. 1 to form a fin structure that provides a vertically orientated semiconductor base region on a surface on a semiconductor substrate of a first conductivity type semiconductor material, wherein a second conductivity type semiconductor material is present at an end of the fin structure opposite the end of the fin structure that is in contact with the first conductivity type semiconductor material.

DETAILED DESCRIPTION

Figure 1:
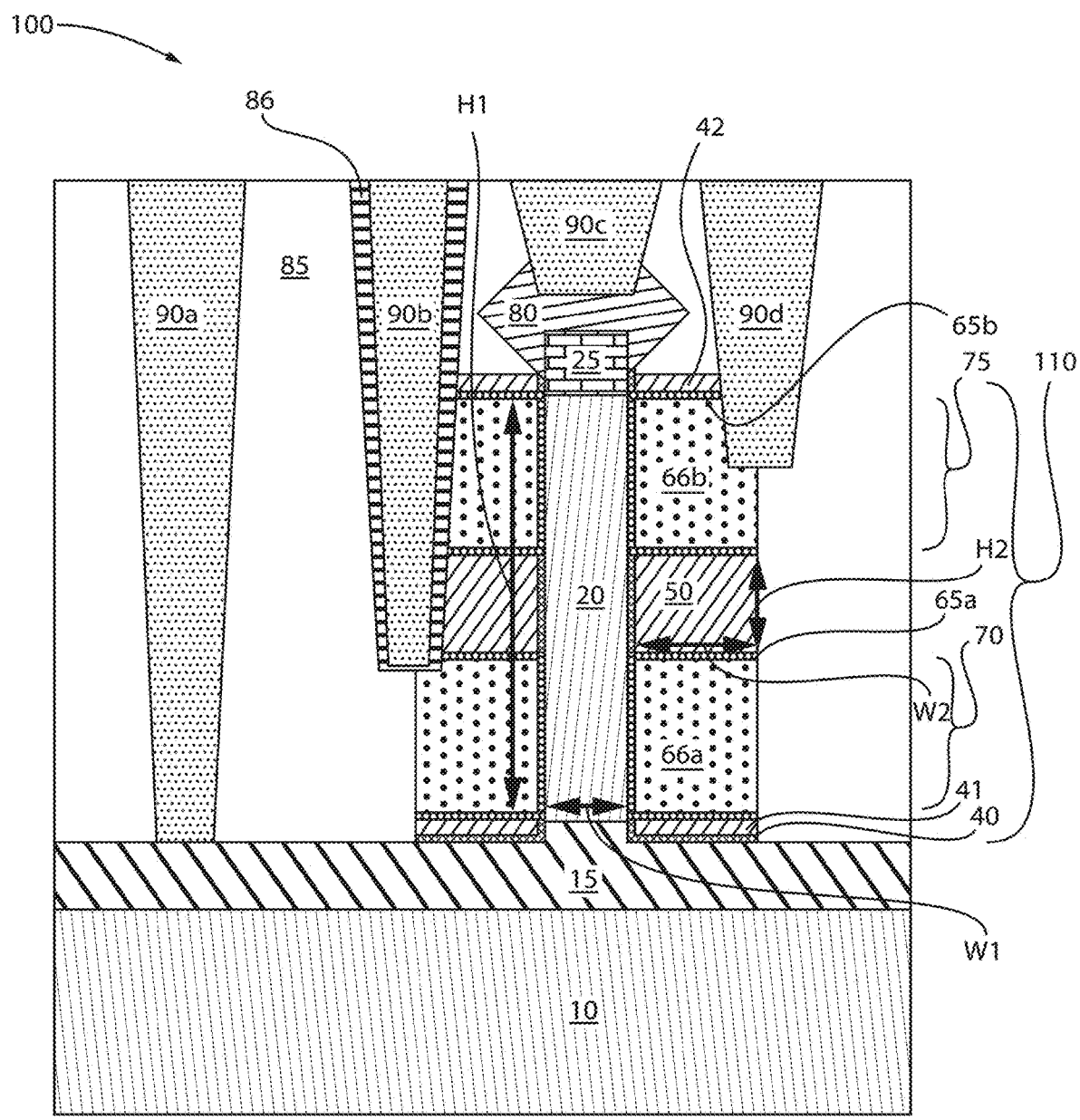
FIG. 1 is a side cross-sectional view of one embodiment of a vertically orientated semiconductor diode including a vertically orientated dual gate structure that is present around the fin structure of the vertically orientated semiconductor diode.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As microelectronics and nanoelectronic devices continue to scale to increasingly smaller devices it can be advantageous to provide different device orientations for planar devices, such as a four diode lateral semiconductor on insulator (SOI), e.g., silicon on insulator, stack with a lateral twin gated diode. As will be further described herein, in some embodiments, the methods and structures of the present disclosure configure a dual gated field effect diode in a vertical design, which can be referred to as a vertical dual gated field effect diode. A field effect diode (FED) is a semiconductor diode, in which the charge carriers are of only one polarity. The methods and structures of the present disclosure are now described with greater detail with reference to FIGS. 1-7.

FIG. 1 depicts one embodiment of a semiconductor diode 100, e.g., field effect diode (FED), having a first conductivity type region 15 on an upper surface of a semiconductor substrate 10, a fin structure 20 atop the first conductivity type region 15 that provides a vertically orientated semiconductor base region, and a second conductivity type region 25, 80 at a second end of the fin structure 20 opposite a first end of the fin structure 20 that is in contact with the first conductivity type region 15. The term "conductivity type" as used herein denotes a p-type conductivity or an n-type conductivity. In some embodiments, the first conductivity type region 15 may be composed of a first conductivity type semiconductor material, such as a type IV semiconductor having an n-type conductivity. As used herein, "n-type" refers to the addition of impurities that contributes free electrons to an intrinsic semiconductor. In some embodiments, the second conductivity type region 25, 80 may be composed of at least one second conductivity type semiconductor material, such as a type IV semiconductor having a p-type conductivity. As used herein, "p-type" refers to the addition of impurities to an intrinsic semiconductor that creates deficiencies of valence electrons.

Examples of type IV semiconductors that are suitable for use as the semiconductor material for the first conductivity type region 15, and the second conductivity type region 25, 80 may include silicon (Si), crystalline silicon (c-Si), monocrystalline silicon, germanium, silicon germanium (SiGe), silicon doped with carbon (Si:C), silicon germanium doped with carbon (SiGe:C) and a combination thereof, and similar semiconductors, e.g., semiconductor materials including at least one element from Group IVA (i.e., Group 14) of the Periodic Table of Elements. In a type IV semiconductor material, examples of n-type dopants, i.e., impurities, include but are not limited to: boron, aluminum, gallium and indium. The dopant that provides the n-type conductivity for the first conductivity type semiconductor material that provides the first conductivity type region 15 may be present in a concentration ranging from $1\times10^{19}$ atoms/cm$^3$ to $4\times10^{20}$ atoms/cm$^3$. The dopant that provides the p-type conductivity of the second conductivity type semiconductor material that provides the second conductivity type region 25, 80 may be present in a concentration ranging from $1\times10^{17}$ atoms/cm$^3$ to $2\times10^{19}$ atoms/cm$^3$.

The at least one second conductivity type semiconductor material 25, 80 may include a first portion 25 that is formed on the material stack that includes the material layer for the fin structure 20, in which the first portion 25 is patterned during the process sequence that patterns the fin structure 20. The second portion 80 of the at least one second conductivity type semiconductor material 25, 80 may be an epitaxially formed material that is formed after the fin structure 20 has been patterned. In some embodiments, the dopant concentration of the epitaxial formed material the provides the second portion 80 of the at least one second conductivity type semiconductor material 25, 80 is greater than the dopant concentration of the first portion 25 of the second conductivity type semiconductor material 25, 80.

The first conductivity type region 15 and the second conductivity type region 25 are present on opposing ends of a fin structure 20 that provides the vertically orientated semiconductor base region of the semiconductor diode. As used herein, a "fin structure" refers to a semiconductor material, which is employed as the body of a semiconductor diode, in which the gate structure is positioned around the fin structure such that charge flows down the fin structure. Fin structures 20 have a greater height H1 than width W1. For example, the fin structure 20 can have a height H1 ranging from 5 nm to 200 nm. In another embodiment, the fin structure 20 has a height H1 ranging from 10 nm to 100 nm. In one example, the fin structure 20 has a height H1 ranging from 20 nm to 50 nm. In one embodiment, the fin structure 20 can have a width W1 of less than 15 nm. In another embodiment, the fin structure 20 has a width W1 ranging from 3 nm to 8 nm.

The fin structure 20 may be composed of an intrinsic semiconductor, such as an intrinsic type IV semiconductor material. By "intrinsic" it is meant that the region is not doped with an extrinsic dopant, e.g., n-type or p-type dopant. In some embodiments, an intrinsic semiconductor, also called an undoped semiconductor or i-type semiconductor, is a pure semiconductor without any significant dopant species present. The number of charge carriers is therefore determined by the properties of the material itself instead of the amount of impurities. In some embodiments, in intrinsic semiconductors the number of excited electrons and the number of holes are substantially equal. In one example, the maximum amount of n-type or p-type dopant that may be present in the semiconductor material that provides the fin structure 20 may be no greater than $5\times10^{18}$ atoms/cm$^3$. In another example, the maximum amount of n-type or p-type dopant that may be present in the semiconductor material that provides the fin structure 20 may be no greater than $5\times10^{17}$ atoms/cm$^3$. In yet another example, the fin structure 20 may be doped with p-type dopant, i.e., having a same conductivity as the anode region, in which the dopant is present at a concentration of $5\times10^{16}$ atoms/cm$^3$.

Examples of type IV semiconductor that are suitable for the fin structure 20 include silicon (Si), crystalline silicon (c-Si), monocrystalline silicon, germanium, silicon germanium (SiGe), silicon doped with carbon (Si:C), silicon germanium doped with carbon (SiGe:C) and a combination thereof, and similar semiconductors, e.g., semiconductor materials including at least one element from Group IVA (i.e., Group 14) of the Periodic Table of Elements.

The fin structure 20 that provides a semiconductor base region for the semiconductor diode 100, e.g., field effect diode (FED), that is vertically orientated. By "vertical" semiconductor diode it is meant that the first conductivity type region 15, the semiconductor base region provided by the fin structure 20 and the second conductivity type region 25, 80 are arranged perpendicular to the plane of the substrate 10 surface, which is referred to as a vertical stack. A vertically stacked semiconductor diode can have a longer gate length (i.e., height) than a horizontal semiconductor diode in which the first conductivity type region, the second conductivity type region, and the semiconductor base region components are arranged parallel with the plane of the substrate surface).

Still referring to FIG. 1, the semiconductor device, e.g., field effect diode (FED), includes a vertically orientated dual gate structure 110 around the fin structure 20. The vertically orientated dual gate structure 110 includes a first gate structure 70 that is present closest to the first conductivity type region 15 and the supporting substrate 10, and a second gate structure 75 that is in closer proximity to the second conductivity type region 25, 80 than the first conductivity type region 15. In some embodiments, the first gate structure 70 is separated from the second gate structure 75 by a dielectric inter-gate spacer 50. The term "vertically orientated" when describing the dual gate structure means that the first gate structure 70, the inter-gate spacer 50 and the second gate structure 75 arranged perpendicular to the plane of the substrate 10 surface.

The first gate structure 70 includes a first gate dielectric 65a and a first gate conductor 66a. In some embodiments, the first gate structure 70 is separated from the first conductivity type region 15 by a first dielectric spacer 41. The first dielectric spacer 41 may be composed of any dielectric material, such as an oxide, nitride or oxynitride material. In one example, the first dielectric spacer 41 is composed of a nitride, such as silicon nitride. In some embodiments, a dielectric liner 40 is present between the first dielectric spacer 41 and the first conductivity type region 15. The dielectric liner 40 may be composed of any dielectric material, such as an oxide, nitride or oxynitride material. In one embodiment, the dielectric liner 40 is composed of an oxide, such as silicon oxide.

In one embodiment, the at least one gate dielectric 65a of the first gate structure 70 includes, but is not limited to, an oxide, nitride, oxynitride and/or silicates including metal silicates, aluminates, titanates and nitrides. In one example, when the at least one gate dielectric layer 65a is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. In some embodiments, the at least one gate dielectric layer 65a can be composed of a high-k dielectric material. High-k dielectric materials have a dielectric constant greater than silicon oxide ($SiO_2$). For example, high-k dielectrics having a dielectric constant greater than 4.0 at room temperature, e.g., 20° C. to 25° C. and atmospheric pressure, e.g., 1 atm. In one embodiment, the least one gate dielectric layer 65a may be provided by a high-k dielectric material. In one embodiment, the least one gate dielectric layer 65a is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one first gate dielectric layer 65a include hafnium silicate, hafnium silicon oxynitride or combinations thereof. The at least one first gate dielectric 65a may be in direct contact with a sidewall of a lower portion of the fin structure 20. The physical thickness of the at least one first gate dielectric layer 65a may vary, but typically, the at least one first gate dielectric layer 65a can have a thickness from 1 nm to 10 nm. In another embodiment, the at least one first gate dielectric layer 65a has a thickness from 1 nm to 3 nm. The thickness of the at least one first gate dielectric layer 65a is uniform and continuous.

The at least one first gate dielectric layer 65a may have a U-shaped geometry when viewed from a side cross-sectional view, as depicted in FIG. 1. A vertical portion of the at least one first gate dielectric layer 65a is present on a lower portion of the fin structure 20, and horizontal portions of the at least one first gate dielectric layer 65a are present on the first dielectric spacer 41 and the dielectric inter-gate spacer 50.

The conductive material that provides the first gate conductor 66a may comprise polysilicon, SiGe, a silicide, a metal or a metal-silicon-nitride such as Ta—Si—N. Examples of metals that can be used as the first gate conductor 66a include, but are not limited to, Al, W, Cu, and Ti or other like conductive metals.

The second gate structure 75 includes a second gate dielectric 65b and a second gate conductor 66b. A second dielectric spacer 42 may be present on an uppermost surface of the second gate structure 75. The second dielectric spacer 42 may be composed of any dielectric material, such as an oxide, nitride or oxynitride material. In one example, the second dielectric spacer 42 is composed of a nitride, such as silicon nitride.

The second gate structure 75 is similar to the first gate structure 70, in which the second gate structure 75 is present on an upper portion of the fin structure 20 that is closest to the second conductivity type region 25, 80 and the first gate structure 70 is present on a lower portion of the fin structure 20. Similar to the first gate structure 70, the second gate structure includes at least one gate dielectric (referred to as the at least one second gate dielectric 65b) and a gate conductor (referred to as the second gate conductor 66b). Therefore, the above description of the composition and geometry for the at least one first gate dielectric 65a and the first gate conductor 66a for the first gate structure 70 is suitable for describing at least one embodiment of the composition and geometry for the at least one second gate dielectric 65b and the second gate conductor 66b. For example, the second gate dielectric 65b may have a U-shaped geometry when viewed from a side cross-sectional perspective, as depicted in FIG. 1.

The inter-gate spacer 50 separates the first gate structure 70 from the second gate structure 75. The inter-gate spacer 50 may be composed of a dielectric material. Any dielectric material may be suitable for the inter-gate spacer 50. For example, the dielectric used for the inter-gate spacer 50 may be an oxide containing material, nitride containing material, oxynitride containing material or a combination thereof. In some examples, the dielectric material for the integrate spacer 50 may be a low-k dielectric material. As used herein, the term "low-k" denotes a dielectric material having a dielectric constant equal to the dielectric constant of silicon oxide ($SiO_2$) or less at room temperature, e.g., 20° C. to 25° C. and atmospheric pressure, e.g., 1 atm. Examples of materials suitable for the low-k dielectric material include SiBCN, SiOCN, SiOC diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. In some examples, the dielectric material for the integrate spacer 50 may be a high-k dielectric material. High-k dielectric materials have a dielectric constant greater than silicon oxide ($SiO_2$). For example, high-k dielectrics having a dielectric constant greater than 4.0 at room temperature, e.g., 20° C. to 25° C. and atmospheric pressure, e.g., 1 atm. In one embodiment, the least one gate dielectric layer may be provided by a high-k dielectric material. In one embodiment, the least one gate dielectric layer is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the dielectric inter-gate spacer 50 include hafnium silicate, hafnium silicon oxynitride or combinations thereof.

In some embodiments, the inter-gate spacer 50 has a height H2 as great as 150 nm. In one embodiment, the inter-gate spacer 50 has a height H2 ranging from 2 nm to 100 nm. In some embodiments, the inter-gate spacer 50 has a width W2 that is selected to be as small as possible to provide higher device density. In one example, the inter-gate spacer 50 has a width W2 ranging from 10 nm to 100 nm.

In one embodiment, the length of a first gate structure 70 in the vertically orientated dual gate structure is the same as the length of a second gate structure 75. In another embodiment, the length of the first gate structure 70 in the vertically orientated dual gate structure is the greater than a length of the second gate structure 75.

Still referring to FIG. 1 in some embodiments, an inter-level dielectric layer 85 can be present overlying the fin structure 20, the first conductivity type semiconductor material that provides the first conductivity type region 15, the second conductivity type semiconductor material that provides the second conductivity type region 25, 80 and the vertically orientated dual gate structure 110. The interlevel dielectric layer 80 may be composed of any dielectric material, such as an oxide, nitride or oxynitride material. For example, the interlevel dielectric layer 85 may be composed of any dielectric material used in microelectronic and nanoelectronic structures, which can include $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H).

The semiconductor diode 100, e.g., field effect diode (FED), can further include an anode contact 90a extending through an interlevel dielectric layer 85 to the first conductivity type region 15, and a cathode contact 90c extending through the interlevel dielectric layer 85 to the second conductivity type region 25, 80. The semiconductor diode 100 can also include a first gate contact 90b extending through the interlevel dielectric layer 85 to the first gate structure 70, and a second gate contact 90d through the interlevel dielectric layer 85 to the second gate structure 75. Each of the anode contact 90a, first gate contact 90b, cathode contact 90c and second gate contact 90d may be composed of an electrically conductive material, such as a metal or a doped semiconductor material. The metal may be one of copper, aluminum, titanium, tungsten, platinum or combinations thereof. The doped semiconductor material may be polysilicon doped with an n-type dopant. The first gate contact 90b in reaching the first gate structure 70 may extend past the second gate structure 75, wherein electrical isolation from the second gate structure 75 may be provided by a dielectric via liner 86 that is present on the sidewall of the portion of via containing the first gate contact 90b at the depth at which the second gate structure 75 is present. The dielectric via liner 86 separates the electrically conductive portion of the first gate contact 90b from the second gate structure 75. The dielectric via liner 86 is not present at the base of the via at which the first gate contact 90b is in electric contact, i.e., direct contact, with the first gate structure 70. The dielectric via liner 86 may be composed of any dielectric material, such as oxide containing dielectrics, nitride containing dielectrics, oxynitride containing dielectrics or combinations thereof.

In some embodiments, the semiconductor diode 100, e.g., field effect diode (FED), depicted in FIG. 1 includes a vertically orientated channel having length defined by its height H1 that is encapsulated by two independent gate structures, the first gate structure 70 and the second gate structure 75, in which the gate structures 70, 75 are separated by the inter-gate spacer 50 (also referred as gap dielectric). The semiconductor device 100, e.g., field effect diode (FED), depicted in FIG. 1 has oppositely doped terminals, i.e., first conductivity type region 15 and second conductivity type region 25, 80.

In operation, the first gate structure 70 is biased high with respect to the second gate structure 75 creating an inverted n-type body device proximate to the first gate structure 70. In this state, the semiconductor diode 100, e.g., field effect diode (FED), acts as PNPN diode structure. In some embodiments, which the voltage to the first gate structure 70 is high with respect to the second gate structure 75 most of the anode voltage is dropped across the reversed biased junction that is present between the two gate structures, thus preventing current from passing through the dual gated semiconductor diode 100, in which the dual gated semiconductor diode 100 is in an "OFF" state. In some embodiments, during an electrostatic discharge event (ESD), the dual gated semiconductor diode 100 is changed to a different state, in which the first gate structure 70 is left floating, or shorted to the second gate structure 75, hence allowing the field effect diode (FED), i.e., semiconductor diode 100, to act as one PN junction. In some embodiments, the dual gated field effect diode (FED) has reduced capacitance in the "OFF", i.e., normal operation, state due to the existence of three junctions in series, one of which is reverse biased (PNPN). FIG. 2 includes field effect diode (FED) states for different gate and anode biases in accordance with one embodiment of the semiconductor device 100.

It is noted that the device described herein is symmetrical in geometry. Therefore, the anode and cathode may be reversed. For example, if the structure identified by reference number 90c is a cathode, and the structure identified by reference number 90a is an anode, then the structures identified by reference numbers 80 and 25 can be n-type doped, i.e, n+, whereas the structure identified by reference number 15 is to be p-type doped, i.e., p+. In another example, if the structure identified by reference number 90c is an anode and the structure identified by reference number 90a is a cathode, then the structures identified by reference numbers 80 and 25 can be p-type doped, i.e., p+, whereas the structure identified by reference number 15 is to be n-type doped, i.e., n+. Following the orientation in FIGS. 1 and 2, the gate structure next to the anode is the first gate structure, while the gate next to the cathode is the second gate structure. In the embodiments, in which the anode and cathode are swapped, the first gate structure and second gate structure are also swapped.

FIGS. 3-7 depict one embodiment of a method for forming the vertically orientated semiconductor diode 100 including the vertically orientated dual gate structure 110 that has been described above with reference to FIGS. 1 and 2. In one embodiment, the method of forming the semiconductor diode 100, e.g., field effect diode (FED), includes the steps of forming a fin structure 20 of a base semiconductor material having a first end present on a first conductivity type semiconductor material that provides a first conductivity type region 15, wherein a second type conductivity semiconductor material is present at a second end of the fin structure 20 that provides a second conductivity type region 25, 80; and forming a vertically orientated dual gate structure 110 on the fin structure 30.

FIG. 3 depicts one embodiment of a material stack 5 for forming one embodiment of a semiconductor diode 100, e.g., field effect diode (FED). In one embodiment, the material stack 5 may be provided by forming a layer of the first conductivity type semiconductor material (for the first conductivity type region 15) present on a supporting substrate 10, and forming a layer of the base semiconductor material (for the fin structure 20) on the layer of the first conductivity type semiconductor material. Thereafter, a layer for the second conductivity type semiconductor material (for the second conductivity type region 25) is formed on layer of the first conductivity type semiconductor material.

The supporting substrate 10 may be composed of semiconductor material, such as a type IV semiconductor or a type III-V semiconductor. For example, the supporting substrate 10 may be composed of silicon (Si). In some embodiments, the supporting substrate 10 is a bulk substrate, as depicted in FIG. 3. It is noted that the supporting substrate 10 may also be provided by a semiconductor on insulator (SOI) substrate, i.e., silicon on insulator substrate.

The first conductivity type semiconductor material for the first conductivity type region 15 may be epitaxially formed on the supporting substrate 10 using an epitaxial growth process. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. A material that is "epitaxial" is a material that has been formed using an epitaxial deposition process.

The first conductivity type semiconductor material for the first conductivity type region 15 may can be a type IV semiconductor containing material layer. For example, the first conductivity type semiconductor material for the first conductivity type region 15 may be composed of silicon (Si), germanium (Ge), silicon germanium (SiGe) and other semiconductor materials. The epitaxial deposition process may employ the deposition chamber of a chemical vapor deposition type apparatus, such as a PECVD apparatus. In some embodiments, the gas source for the epitaxial deposition of the first conductivity type semiconductor material for the first conductivity type region 15 may include silicon (Si) deposited from silane, disilane, trisilane, tetrasilane, hexachlorodisilane, tetrachlorosilane, dichlorosilane, trichlorosilane, disilane and combinations thereof. The temperature for epitaxial silicon germanium deposition typically ranges from 450° C. to 900° C. Although higher temperature typically results in faster deposition, the faster deposition may result in crystal defects and film cracking.

The first conductivity type semiconductor material for the first conductivity type region 15 is doped with either an n-type or p-type dopant. In the embodiment that is described with reference to FIGS. 1-7, the first conductivity type is n-type and the second conductivity type is p-type. In other embodiments, the first conductivity type may be p-type and the second conductivity type can be n-type.

The dopant that provides the conductivity type for the first conductivity type semiconductor material for the first conductivity type region 15 may be introduced to the semiconductor material using "in situ" doping. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In one embodiment, the n-type gas dopant source may include arsine ($AsH_3$), phosphine ($PH_3$) or combinations thereof. In one example, the first conductivity type semiconductor material for the first conductivity type region 15 may be in-situ doped to provide the n-type conductivity that is provided by a phosphorus dopant.

Following the formation of the first conductivity type semiconductor material for the first conductivity type region 15, a base semiconductor material is formed for the fin structure 20. The semiconductor base region provided by the fin structure 20 may be epitaxially formed directly on the first conductivity type semiconductor material for the first conductivity type region 15. Similar to the first conductivity type region 15, the semiconductor material for the semiconductor base region for the fin structure 20 may be a type IV semiconductor material, such as silicon or silicon germanium. Therefore, the above description of the epitaxial deposition process for forming the first conductivity type semiconductor material for the first conductivity type region 15 is suitable for describing at least one embodiment of forming the base semiconductor material for the fin structure 20. The deposition process is continued until the thickness of the semiconductor base region is equal to the desired height of the fin structure 20.

Still referring to FIG. 3, the layer for the second conductivity type semiconductor material for the second conductivity type region 25 is formed on layer of the first conductivity type semiconductor material using an epitaxial deposition process. Similar to the first conductivity type semiconductor material, the second conductivity type semiconductor material may be composed of a type IV semiconductor, such as silicon, silicon germanium and/or germanium. Therefore, the above description of the epitaxial deposition process for forming the first conductivity type semiconductor material for the first conductivity type region 15 is suitable for describing at least one embodiment of forming the second conductivity type semiconductor material for the second conductivity type region 25. The second conductivity type region 25 is doped to an opposite conductivity type than the conductivity type of the first conductivity type region 15. For example, if the first conductivity type region 15 is doped to an n-type conductivity, the second conductivity type region 25 is doped a p-type conductivity. The p-type dopant may be introduced to the second conductivity type region 25 by in situ doping. The p-type dopant that provided the p-type conductivity for the second conductivity type region 25 may be boron. The p-type gas dopant source may include diborane ($B_2H_6$).

FIG. 4 depicts one embodiment of patterning and etching the material stack 5 depicted in FIG. 3 to form a fin structure 20 that provides a vertically orientated semiconductor base region on a surface of a first type conductivity semiconductor material 15, wherein a second conductivity type semiconductor material 25 is present at an end of the fin structure 20 opposite the end of the fin structure 20 that is in contact with the first type conductivity semiconductor material 15. In one embodiment, the patterning and etching of the material stack 5 includes etching at least the layer of the second conductivity type semiconductor material 25 and the layer of the base semiconductor material of the material stack to form the fin structure 30 of the base semiconductor material having a first end present on a first conductivity type semiconductor material 15. The second type conductivity semiconductor material 25 is present at a second end of the fin structure 20 opposite the first end.

Patterning and etching the material stack 5 may begin with forming a hardmask, i.e., dielectric fin cap 35, atop the material layer of the second type conductivity semiconductor material 25. Any dielectric material may be present in the dielectric fin cap 35. For example, the dielectric fin cap 35 may be provided by an oxide, e.g., silicon oxide, or nitride, e.g., a silicon nitride. The hardmask layer may be deposited using chemical vapor deposition process, such as chemical vapor deposition (CVD).

Following formation of the hardmask layer, an etch mask may be formed over the hard mask layer that is patterned to define the dielectric fin cap 35 using an etch process. The etch mask may be a photoresist mask that is formed using deposition, photolithography and development steps. The width of the etch mask is selected to provide the width of the dielectric fin cap 35. The dielectric fin cap 35 can be used to etch the underlying second conductivity semiconductor material for the second conductivity type region 25, and the underlying base semiconductor material that provides the fin structure 20. Following formation of the etch mask, the pattern of the etch mask may be transferred into the hardmask layer to provide the dielectric fin cap 35. The pattern transfer may be achieved by utilizing at least one etching process that can include dry etching, such as reactive ion etching (RIE), plasma etching, ion beam etching or laser ablation, chemical wet etch processes or a combination thereof. In one embodiment, the etch process for forming the dielectric fin cap 35 is an anisotropic etch process. In one example, the etch process used to transfer the pattern may include one or more reactive ion etching (RIE) steps. In some embodiments, the etch process may be an etch process including a chemistry that is selective to the semiconductor material for the second conductivity type region 25. In this example, following patterning the hardmask dielectric layer to provide the dielectric fin cap 35, a second etch process may etch the semiconductor material layers that provide the second conductivity type region 25, and the base semiconductor material that provides the fin structure 20. In some embodiments, the second etch process may be selective to first conductivity type semiconductor material of the first conductivity type region 15. The etch mask may then be removed. It is noted that the aforementioned process flow is only one example of forming a fin structure 20. In another embodiment, the fin structure 25 may be formed using a spacer image transfer (SIT) process.

Figure 5:
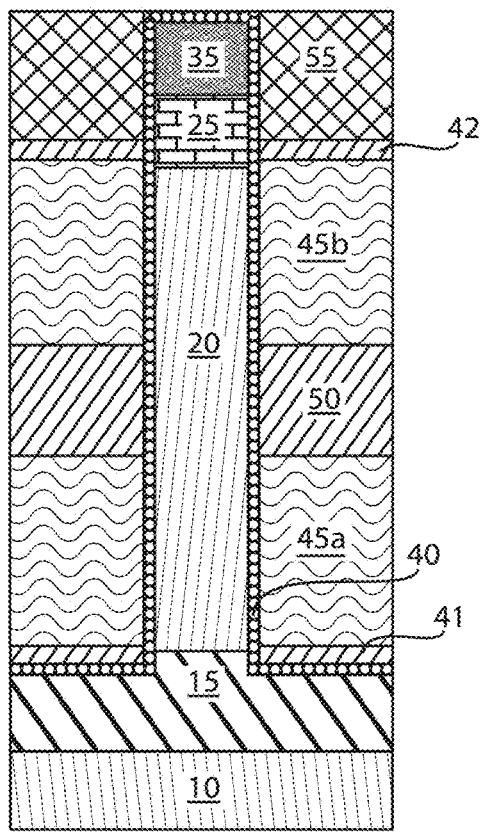
FIG. 5 is a side cross-sectional view depicting forming a thin dielectric liner on the structure depicted in FIG. 4, and forming a sacrificial gate structure on the thin dielectric liner over the fin structure that provides the vertically orientated semiconductor base region of the device, in accordance with one embodiment of the present disclosure.
Figure 6:
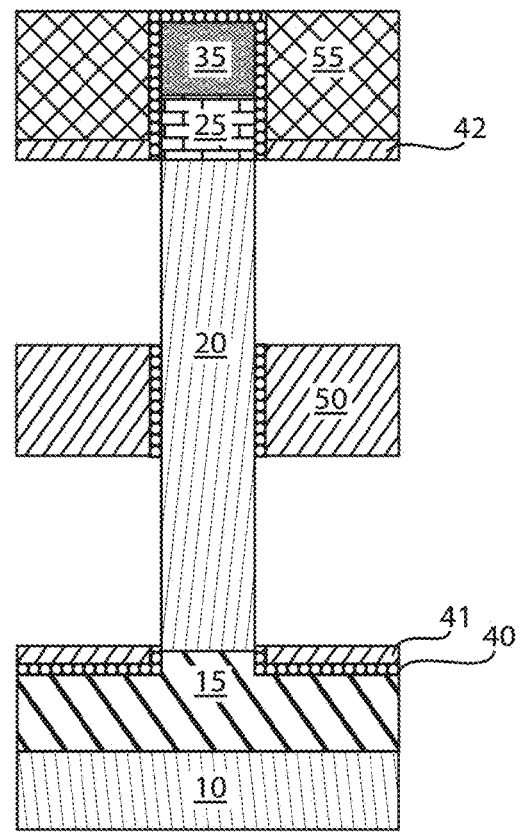
FIG. 6 is a side cross-sectional view depicting removing the sacrificial gate structure and removing the exposed portion of the thin dielectric liner selectively to the vertically orientated semiconductor base region.
Figure 7:
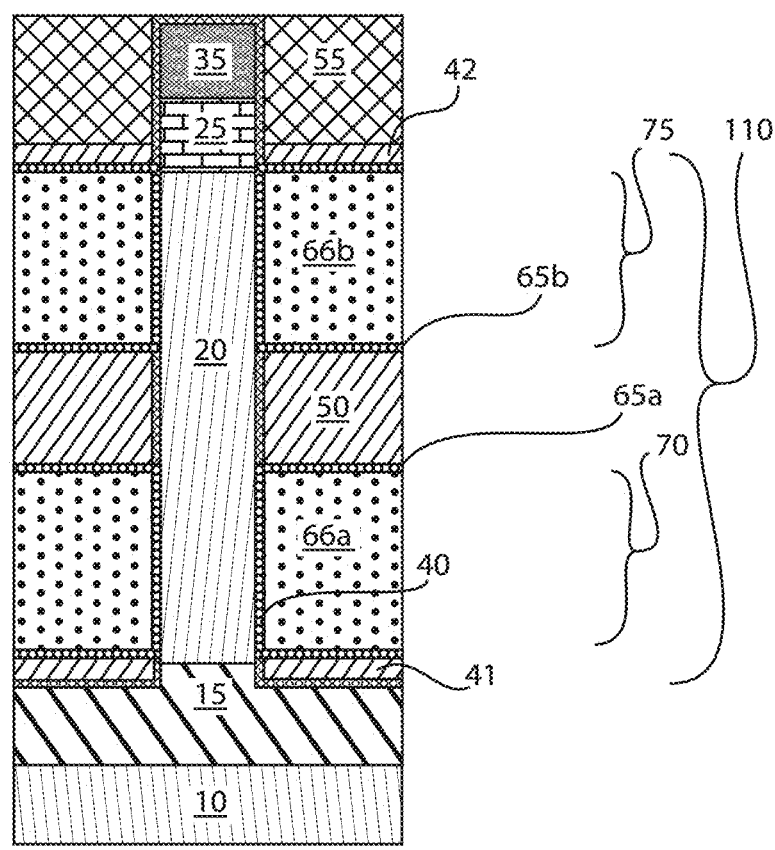
FIG. 7 is a side cross-sectional view depicting forming a gate structure including a gate dielectric on exposed portions of the fin structure that provides the vertically orientated semiconductor base region of the device, in accordance with one embodiment of the present disclosure.

FIGS. 5-7 illustrate one embodiment of forming a vertically orientated dual gate structure 110. The vertically orientated dual gate structure 110 is present around the fin structure 20 and includes a first gate structure 70 that is present overlying the semiconductor substrate 10 and a second gate structure 75 that is in closer proximity to the second conductivity type semiconductor material of the second conductivity type region 25 than the first conductivity type semiconductor material of the first conductivity type region 15. The first gate structure 70 is separated from the second gate structure 75 by a dielectric inter-gate spacer 50. In some embodiments forming the vertically orientated dual gate structure 110 includes applying a replacement gate structure that can begin with forming a dielectric liner 40 on at least the fin structure 20.

FIG. 5 depicts forming a thin dielectric liner 40 on the structure depicted in FIG. 4, and forming sacrificial gate structures 45a, 45b on the thin dielectric liner 40 over the fin structure 20 that provides the vertically orientated semiconductor base region of the device. The thin dielectric liner 40 may be deposited using a deposition process, such as chemical vapor deposition (CVD). Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. The thin dielectric liner 40 may be a continuous layer of a conformal thickness. The term "conformal" denotes a layer having a thickness that does not deviate from greater than or less than 30% of an average value for the thickness of the layer. The thin dielectric liner 40 may have a thickness ranging from 1 nm to 10 nm. In one example, the thin dielectric liner 40 is composed of silicon oxide.

Following the formation of the thin dielectric liner 40, the method may continue with forming a gate stack comprising a first dielectric spacer 41 on a portion of the dielectric liner 40 overlying the first conductivity type semiconductor material 15 present on the supporting substrate 10; forming a first sacrificial gate structure 45a on the first dielectric spacer 41; forming a dielectric inter-gate spacer 50 on the first sacrificial gate structure 45a; and forming a second sacrificial gate structure 45b on the dielectric inter-gate spacer 50, as depicted in FIG. 5.

The first dielectric spacer 41 is composed of a dielectric material, such as a nitride, e.g., silicon nitride, which is formed directly atop the thin dielectric liner 40. The first dielectric spacer 41 may be deposited using a chemical vapor deposition (CVD) process like the CVD processes described for forming the dielectric liner 40. For example, the first dielectric spacer 41 can be deposited using plasma enhanced chemical vapor deposition (PECVD), and can have a thickness ranging from 5 nm to 20 nm. The material layer for the first dielectric spacer 41 is blanket deposited.

Following the material layer for the first dielectric spacer 41, a material layer for the first sacrificial gate structure 45a is formed. The first sacrificial gate structure 45a is composed of a material that may be removed selectively to at least the dielectric inter-gate spacer 50. The term "selective" means that a first material may be etched at a faster rate to a second material. For example, the selective etch rate may remove a first material at a rate greater than 20:1, e.g., greater than 100:1, in comparison to a second material. In some embodiments, the first sacrificial gate structure 45a may be composed of a material that can be removed selectively to the dielectric liner 40 that is present on the sidewall of the fin structure 20. In one example, the first sacrificial gate structure 45a is composed of polysilicon. The material layer for the first sacrificial gate structure 45a may be deposited using a chemical vapor deposition (CVD) process, such as Atmospheric Pressure CVD (APCVD), Low Pressure CVD (LPCVD) and Plasma Enhanced CVD (PECVD), Metal-Organic CVD (MOCVD) and combinations thereof. The thickness of the material layer for the second sacrificial gate structure 45b is selected to provide the dimensions for the second functional gate structure, i.e., second gate structure 75. In one example, the thickness of the material layer for the first sacrificial gate structure 45a may range from 10 nm to 100 nm.

Following the material layer for the first sacrificial gate structure 45a, a material layer for the dielectric inter-gate spacer 50 is formed. The dielectric inter-gate spacer 50 provides that the first gate structure 70 and the second gate structure 75 are electrically isolated from one another, in which the thickness of the material layer for the dielectric inter-gate spacer 50 dictates the vertical offset separating the first gate structure 70 from the second gate structure 75. In one example, the material layer for the inter-gate spacer 50 can be composed of a nitride, such as silicon nitride. The material layer for the dielectric inter-gate spacer 50 may be deposited using a chemical vapor deposition (CVD) process, such as Atmospheric Pressure CVD (APCVD), Low Pressure CVD (LPCVD) and Plasma Enhanced CVD (PECVD), Metal-Organic CVD (MOCVD) and combinations thereof. The thickness of the material layer for the dielectric inter-gate spacer 50 may range from 10 nm to 100 nm.

Following the formation of the material layer for the dielectric inter-gate spacer 50, a material layer for the second sacrificial gate structure 45b may be formed directly on the dielectric inter-gate spacer 50. The second sacrificial gate structure 45b is similar to the first sacrificial gate structure 45a. Therefore, the description of forming the first sacrificial gate structure 45a is suitable for describing one embodiment of forming the second sacrificial gate structure 45b. For example, the second sacrificial gate structure 45b may be composed of polysilicon. The thickness of the material layer for the second sacrificial gate structure 45b is selected to provide the dimensions for the second functional gate structure, i.e., second gate structure 75. In one example, the thickness of the material layer for the second sacrificial gate structure 45b may range from 10 nm to 100 nm.

A material layer for the second dielectric spacer 42 may be formed directly on the second sacrificial gate structure 45b. The second dielectric spacer 42 is similar to the first dielectric spacer 41. Therefore, the description of forming the first dielectric spacer 41 is suitable for describing one embodiment of forming the second dielectric spacer 42. For example, the second dielectric spacer 42 may be composed of a nitride, such as silicon nitride. In one example, the thickness of the material layer for the second dielectric spacer 42 may range from 5 nm to 20 nm.

Following the formation of the material layer for the second dielectric spacer 42, an oxide capping layer 55 is formed atop the second dielectric spacer 42. The oxide capping layer 55 may be composed of silicon oxide. The oxide capping layer 55 may be deposited using a CVD deposition process followed by a planarization process, such as chemical mechanical planarization to provide an upper surface that is coplanar with the portion of the dielectric liner 40 that is present atop the dielectric fin cap 35.

The aforementioned material layers may then be patterned and etched to provide the geometry of the vertically orientated dual gate structure 110. More specifically, a photoresist etch mask may be formed atop the oxide capping layer 55. The material stack can then be etched with an etch process, such as an anisotropic etch process, e.g., reactive ion etching (RIE), to provide the geometry of the vertically orientated dual gate structure 110.

Forming the vertically orientated dual gate structure 110 may also include substituting the first and second sacrificial gate structures 45a, 45b with first and second functional gate structures 70, 75, as described with reference to FIGS. 6 and 7.

FIG. 6 depicts one embodiment of removing the sacrificial gate structures 45a, 45b and removing the exposed portion of the thin dielectric liner 40 selectively to the fin structure 20 providing the vertically orientated semiconductor base region. In one embodiment, removing the sacrificial gate structures 45a, 45b includes etching the first and second sacrificial gate structures 45a, 45b selectively to at least the dielectric inter-gate spacer 50 and the dielectric liner 40 that is present on the fin structure 20. Thereafter, the exposed portions of the dielectric liner 50 may be removed by an etch process that is selectively to the fin structure 20. The etch process for removing the exposed portions of the dielectric liner 40 can be an isotropic etch process.

Functional gate structures 70, 75 are formed in the openings produced by removing the sacrificial gate structures 45a, 45b. The functional gate structures 70, 75 function to switch a semiconductor diode 100 from an "on" to "off" state, and vice versa.

FIG. 7 depicts forming gate structures 70, 75 including forming a gate dielectric 65a, 65b on exposed portions of the fin structure 20 that provides the vertically orientated semiconductor base region of the device, and forming a gate conductor 66a, 66b on the gate dielectric 65a, 65b. The gate dielectric 65a, 65b may be deposited using a conformal deposition process, e.g., plasma enhanced chemical vapor deposition. Each gate dielectric 65a, 65b may have a U-shaped geometry when viewed from the side cross-sectional view depicted in FIG. 7. For example, a vertically orientated portion of each gate dielectric 65a, 65b may be present on the fin structure 20, and horizontally orientated portions of the gate dielectrics 65a, 65b may be formed on the sidewalls of the first dielectric spacer 41, the second dielectric spacer 42 and the dielectric inter-gate spacer 50 that are exposed by removing the sacrificial gate structures 45a, 435b. In some embodiments, the gate dielectric 65a for the first gate structure 70 may have a same composition as the gate dielectric 65b for the second gate structure 75. In some embodiments, the first gate dielectric 65a for the first gate structure 70 may have a different composition as the second gate dielectric 65b for the second gate structure 75. In some embodiments, the gate dielectrics 65a, 65b may be composed of high-k dielectric materials, such as hafnium oxide.

Following the formation of the gate dielectrics 65a, 65b, gate conductors 66a, 66b may be formed directly on the gate dielectrics 65a, 65b. The gate conductors 66a, 66b fill the openings formed by removing the sacrificial gate structures 45a, 45b. In some embodiments, the gate conductor 66a for the first gate structure 70 may have a same composition as the gate conductor 66b for the second gate structure 75. In some embodiments, the gate conductor 66a for the first gate structure 70 may have a different composition as the gate conductor 66b for the second gate structure 75. The gate conductors 66a, 66b may be formed using physical vapor deposition (PVD), chemical vapor deposition (CVD), electroplating and/or plating.

Referring to FIG. 1, in some embodiments, the oxide capping layer 55, the dielectric fin structure 35 and the dielectric liner 40 that are present on a portion of the second conductivity type region 25 are removed to expose the portion of the second conductivity type region 25 that is present atop the fin structure 20. The oxide capping layer 55, the dielectric fin structure 35 and the exposed portion of the dielectric liner 40 may be removed by an etch process, such as an etch process that is selective to the second conductivity type region 25. Thereafter, a second conductivity type epitaxial semiconductor material 80 is formed on the second conductivity type region 25. The second conductivity type epitaxial semiconductor material 80 has the same conductivity type as the second conductivity region 25 on which the second conductivity type epitaxial semiconductor material 80 is directly formed. In some embodiments, the second conductivity type epitaxial semiconductor material 80 has a diamond geometry. In some embodiments, the second conductivity type epitaxial semiconductor material 80 may be composed of silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. The second conductivity type epitaxial semiconductor material 80 is grown using an epitaxial growth or deposition process that may be a selective deposition process. For example, although the epitaxially semiconductor material for the second conductivity type epitaxial semiconductor material 80 orientates to the crystal arrangement of a semiconductor material, the material may not be deposited on the dielectric material of the second dielectric spacer 42.

In some embodiments, an interlevel dielectric layer 85 is formed overlying the fin structure 20, the first conductivity type semiconductor material for the first conductivity type region 15, the second conductivity type semiconductor material for the second conductivity type region 25, 80 and the vertically orientated dual gate structure 110. The interlevel dielectric layer 85 may be deposited using chemical vapor deposition (CVD) and/or spin on deposition.

Still referring to FIG. 1, in some embodiments, the method may further include forming an anode contact 90a, first gate contact 90b, cathode contact 90c and second gate contact 90d through the interlevel dielectric layer 85. The anode contact 90a extends into contact with the first conductivity type semiconductor material 15. The cathode contact 90c extends into contact with the second conductivity type epitaxial semiconductor material 80. The second gate contact 90d extends into contact with the gate conductor 66b of the second gate structure 75. The first gate contact 90b extends past the second gate structure 77 into contact with the gate conductor 66a of the first gate structure 70. The electrically conductive structure of the first gate contact 90b is separated from the second gate conductor 66b by a dielectric via liner 86. In some embodiments, the contacts 90a, 90b, 90c, 90d are formed by forming vias, i.e., openings, through the interlevel dielectric layer 85, and then filling the openings with electrically conductive material, e.g., metals, doped semiconductors and combinations thereof. The via opening may be formed using photolithography and etch processes. For example, a photoresist mask may be formed exposing the portion of the dielectric material layers in which the via opening is to be formed, wherein following formation of the photoresist mask, the via opening may be etched into the interlevel dielectric 85 using an etch process, such as reactive ion etch (RIE). The via opening may be filled with a metal, such as copper, aluminum, titanium, tungsten, platinum or combinations thereof. The electrically conductive material may be deposited into the via opening using physical vapor deposition (PVD). Examples of PVD processes suitable for depositing the metal for the contacts 90a, 90b, 90c, 90d include plating, electroplating, electroless plating, sputtering and combinations thereof.

In some embodiments, the dielectric via liner 86 for the first gate contact 90b is formed on the via sidewalls before filling the via with an electrically conductive fill, e.g., metal. The dielectric via liner 86 may be composed of an oxide, nitride or oxynitride material. In one example, the dielectric via liner 86 may be composed of silicon nitride. The dielectric via liner 86 may be deposited using chemical vapor deposition, e.g., plasma enhanced chemical vapor deposition (PECVD). After depositing the material for the dielectric via liner 86, an anisotropic etch process, such as reactive ion etch (RIE) may remove a portion of the dielectric via liner 86 that is present at the base of the via. Thereafter, the via is filled with electrically conductive material to provide the first gate structure contact 90b that is in electric communication with the gate conductor 66a of the first gate structure 70.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertically orientated diode comprising:
   forming a fin structure of a base semiconductor material having a first end present on a first conductivity type semiconductor material, wherein a second type conductivity semiconductor material is present at a second end of the fin structure opposite the first end; and
   forming a vertically orientated dual gate structure on the fin structure, the vertically orientated dual gate structure including a first gate, an inter-gate spacer directly atop the first gate, and a second gate directly atop the inter-gate spacer, wherein the stack is arranged perpendicular to the plane of an upper surface of the substrate.

2. The method of claim 1, wherein forming the fin structure having said first end present on the first conductivity type semiconductor material and said second end having the second type semiconductor material present thereon comprises:
   forming a material stack of a layer of the first conductivity type semiconductor material present on a supporting substrate, a layer of the base semiconductor material on the layer of the first conductivity type semiconductor material, and a layer of the second conductivity type semiconductor material; and
   etching at least the layer of the second conductivity type semiconductor material and the layer of the base semiconductor material of the material stack to form the fin structure of the base semiconductor material having a first end present on a first conductivity type semiconductor material, wherein a second type conductivity semiconductor material is present at a second end of the fin structure opposite the first end.

3. The method of claim 2, wherein etching the at least the layer of the second conductivity type semiconductor material and the layer of the base semiconductor material comprises forming an etch mask on the layer of the second conductivity type semiconductor material and etching the second conductivity type semiconductor material and the base semiconductor material selectively to the etch mask, wherein after forming the fin structure the etch mask is removed.

4. The method of claim 3, further comprising forming an epitaxial semiconductor material having the second conductivity type on the second type conductivity semiconductor material that is present at the second end of the fin structure.

5. The method of claim 1, wherein the vertically orientated dual gate structure is present around the fin structure and includes a first gate structure that is present overlying the semiconductor substrate and a second gate structure that is in closer proximity to the second conductivity type semiconductor material than the first conductivity type semiconductor material.

6. The method of claim 1, wherein forming a vertically orientated dual gate structure on the fin structure comprises:
   forming a dielectric liner on the fin structure;
   forming a gate stack comprising a first dielectric spacer on a portion of the dielectric liner overlying the first conductivity type semiconductor material present on the supporting substrate; forming a first sacrificial gate structure on the first dielectric spacer;
   forming a dielectric inter-gate spacer on the first sacrificial gate structure;
   forming a second sacrificial gate structure on the dielectric inter-gate spacer; and
   substituting the first and second sacrificial gate structures with first and second functional gate structures.

7. The method of claim 6, wherein the substituting the first and second sacrificial gate structures with the first and second functional gate structures comprises:
   etching the first and second sacrificial gate structures selectively to the dielectric inter-gate spacer and the dielectric liner that is present on the fin structure;
   etching exposed portions of the dielectric liner selectively to the fin structure;
   forming a gate dielectric on portions of the fin structure exposed by etching the exposed portions of the dielectric liner; and
   forming a first gate conductor on a first portion of the gate dielectric in a first opening formed by removing the first sacrificial gate structure, and forming a second gate conductor on a second portion of the gate dielectric in a second opening formed by removing the second sacrificial gate structure.

8. The method of claim 7, wherein an upper portion of the dielectric liner is present on an etch mask that is present on the second conductivity type region at the second end of the fin structure and a dielectric fill is present atop the second dielectric spacer, the method further comprising removing the dielectric fill, the etch mask and the upper portion of the dielectric liner after forming the first and second functional gate structures, and forming an epitaxial semiconductor material having a second conductivity type on the second conductivity type material.

9. The method of claim 8, further comprising forming an interlevel dielectric layer overlying the fin structure, the first conductivity type semiconductor material, the second conductivity type semiconductor material and the vertically orientated dual gate structure.

10. The method of claim 9, further comprising:
    forming an anode contact through the interlevel dielectric layer to the first conductivity type semiconductor material;
    forming a cathode contact through the interlevel dielectric layer to the second conductivity type semiconductor material;
    forming a first gate contact through the interlevel dielectric layer to the first function gate structure; and
    forming a second gate contact through the interlevel dielectric layer to the second functional gate structure.

11. The method of claim 10, wherein the first gate contact includes an electrically conductive structure to the first gate conductor, wherein the electrically conductive structure is separated from the second gate conductor by a dielectric via liner.

12. A method of forming a vertically orientated diode comprising:
    forming a fin structure of a base semiconductor material having a first end present on a first conductivity type semiconductor material, wherein a second type conductivity semiconductor material is present at a second end of the fin structure opposite the first end; and
    forming a vertically orientated dual gate structure on the fin structure, the vertically orientated dual gate structure including a first gate structure that is present overlying a semiconductor substrate and a second gate structure that is in closer proximity to the second conductivity type semiconductor material than the first conductivity type semiconductor material, wherein the first gate structure separated from the second gate structure by a dielectric inter-gate spacer.

13. The method of claim 12, wherein forming a vertically orientated dual gate structure on the fin structure comprises:
    forming a dielectric liner on the fin structure;

forming a gate stack comprising a first dielectric spacer on a portion of the dielectric liner overlying the first conductivity type semiconductor material present on the supporting substrate;

forming a first sacrificial gate structure on the first dielectric spacer;

forming a dielectric inter-gate spacer on the first sacrificial gate structure;

forming a second sacrificial gate structure on the dielectric inter-gate spacer; and substituting the first and second sacrificial gate structures with first and second functional gate structures.

14. The method of claim 13, wherein the substituting the first and second sacrificial gate structures with the first and second functional gate structures comprises:

etching the first and second sacrificial gate structures selectively to the dielectric inter-gate spacer and the dielectric liner that is present on the fin structure;

etching exposed portions of the dielectric liner selectively to the fin structure;

forming a gate dielectric on portions of the fin structure exposed by etching the exposed portions of the dielectric liner; and forming a first gate conductor on a first portion of the gate dielectric in a first opening formed by removing the first sacrificial gate structure, and forming a second gate conductor on a second portion of the gate dielectric in a second opening formed by removing the second sacrificial gate structure.

15. The method of claim 14, wherein an upper portion of the dielectric liner is present on an etch mask that is present on the second conductivity type region at the second end of the fin structure and a dielectric fill is present atop the second dielectric spacer, the method further comprising removing the dielectric fill, the etch mask and the upper portion of the dielectric liner after forming the first and second functional gate structures, and forming an epitaxial semiconductor material having a second conductivity type on the second conductivity type material.

16. The method of claim 15, further comprising forming an interlevel dielectric layer overlying the fin structure, the first conductivity type semiconductor material, the second conductivity type semiconductor material and the vertically orientated dual gate structure.

17. The method of claim 16, further comprising:

forming an anode contact through the interlevel dielectric layer to the first conductivity type semiconductor material;

forming a cathode contact through the interlevel dielectric layer to the second conductivity type semiconductor material;

forming a first gate contact through the interlevel dielectric layer to the first function gate structure; and forming a second gate contact through the interlevel dielectric layer to the second functional gate structure.

18. The method of claim 12, wherein the first gate contact includes an electrically conductive structure to the first gate conductor, wherein the electrically conductive structure is separated from the second gate conductor by a dielectric via liner.

19. The method of claim 12, wherein forming the fin structure having said first end present on the first conductivity type semiconductor material and said second end having the second type semiconductor material present thereon comprises:

forming a material stack of a layer of the first conductivity type semiconductor material present on a supporting substrate, a layer of the base semiconductor material on the layer of the first conductivity type semiconductor material, and a layer of the second conductivity type semiconductor material; and etching at least the layer of the second conductivity type semiconductor material and the layer of the base semiconductor material of the material stack to form the fin structure of the base semiconductor material having a first end present on a first conductivity type semiconductor material, wherein a second type conductivity semiconductor material is present at a second end of the fin structure opposite the first end.

20. The method of claim 19, wherein etching the at least the layer of the second conductivity type semiconductor material and the layer of the base semiconductor material comprises forming an etch mask on the layer of the second conductivity type semiconductor material and etching the second conductivity type semiconductor material and the base semiconductor material selectively to the etch mask, wherein after forming the fin structure the etch mask is removed.

* * * * *